United States Patent [19]

Masuda

[11] 4,399,521

[45] Aug. 16, 1983

[54] MONOLITHIC INTEGRATED CIRCUIT

[75] Inventor: Hajime Masuda, Tokyo, Japan

[73] Assignee: Nippon Electric Co., Ltd., Tokyo, Japan

[21] Appl. No.: 191,116

[22] Filed: Sep. 26, 1980

[51] Int. Cl.³ .............................................. G11C 11/40
[52] U.S. Cl. ..................................... 365/180; 365/149
[58] Field of Search ............... 365/180, 183, 189, 238, 365/149

[56] References Cited

U.S. PATENT DOCUMENTS

4,030,083 6/1977 Bocc ..................................... 365/222

*Primary Examiner*—Terrell W. Fears
*Attorney, Agent, or Firm*—Sughrue, Mion, Zinn, Macpeak & Seas

[57] ABSTRACT

In a semiconductor memory device of the type having PNPN elements for transferring checking and programming currents to a memory cell, and a trigger circuit for activating the PNPN elements at a predetermined potential, a voltage limiting circuit is provided to activate the PNPN elements prior to achieving the triggering potential so that large voltage spikes through the memory elements during the memory checking operation can be prevented.

12 Claims, 11 Drawing Figures

MONOLITHIC INTEGRATED CIRCUIT

BACKGROUND OF THE INVENTION

The present invention relates to a monolithic integrated circuit, and more particularly to a programmable read-only memory (hereinafter abbreviated as P-ROM) in which memory data can be electrically written by means of a programming circuit formed of PNPN elements.

Various types of P-ROM's have been developed, including a PN junction destruction type P-ROM which has the advantages that fuse elements such as nichrome wires or the like are not necessitated and that the conventional technique of manufacturing bipolar transistors can be used. The PN junction destruction type P-ROM is a ROM wherein program information is programmed in a selected memory cell formed of a bipolar transistor by passing a large current through a base-emitter junction of the bipolar transistor. More particularly, in the case of programming binary data consisting of "0" and "1" as memory information, a current is passed through a transistor of a selected memory cell in which information "1" is to be programmed which current is so large that the base-emitter junction of the transistor may be destroyed and thereby short-circuited. On the other hand, for a transistor of a selected memory cell in which information "0" is to be programmed, provision is made such that the base-emitter path of the transistor may not be short-circuited. Of course, the information "1" and "0" could be reversed in the above provision. Thus, by executing the above-described programming treatment for all cells forming the memory elements, information "1", for instance, can be programmed in the cell through which the large current has been passed, and information "0" can be set in the cell through which no large current has been passed. In a memory cell array in a matrix form, the base-collector junction of the cell whose base-emitter path is short-circuited can be advantageously used as a decoupling diode. In addition, the collectors of the respective cells can be connected in common along the respective rows, so that there is no need to isolate the cells from each other in the respective rows. Now, it is to be noted that the above-described PN junction destruction type memory element is used as a read-only memory, because once information has been programmed therein it can keep the information forever unless the element is destroyed or an excessive current is passed through the undestroyed element upon normal operation. Moreover, since programming of information in this memory is relatively easy as described above, a user can program the memory by himself. Accordingly, a memory device must be delivered to the user's hands with no cell being programmed. In other words, all the cells must be in an undestroyed condition (information "0" condition). Therefore, a manufacturer would check memory devices according to a predetermined process, and a user would also check purchased memory devices according to his own process. This checking can be achieved in a simple manner. For instance, a checker selects the respective cells by applying an address data to address terminals of the memory device and then supplies a predetermined sense current (a current smaller than a programming current) to the selected cell, followed by measuring the potential at the output terminal of the memory device. Since the output voltage of the cell whose base-emitter junction has been already destroyed and the output voltage of the undestroyed cell must be different in measured values, whether the memory device is good or bad can be easily determined.

However, what comes into question in this way is that the cell may be destroyed during the check process in the prior art P-ROM. More particularly, it would never occur that the sense current for checking is supplied in the predetermined current value to the selected cell simultaneously with the application of voltage for checking. That is because a sense current is supplied to the cell via a programming circuit having a PNPN element. Moreover, it is difficult to activate this programming circuit having the PNPN element simultaneously with the application of voltage. Accordingly, there exists a considerable time delay before the programming circuit has been activated. In order to achieve a programming operation at a high speed by shortening this time delay, it is necessary to activate the programming circuit as fast as possible. Normally, a voltage clamp circuit (hereinafter called "triggering circuit") is connected to the N-regions (base) of the first stage PN-junction of the PNPN element in the programming circuit for charging the PN-junction to facilitate its conduction. Generally, a voltage (for example, 26 V) applied to the N-region from the triggering circuit is a little lower than a clamp voltage (for example, 28 V) which is applied from a P-ROM programming device in the case of programming a P-ROM. Consequently, the charge-up time in the PNPN element of the programming circuit is shortened, and hence the time required before activation can be shortened.

In the above-described P-ROM, a sufficiently small current (for example, 20 mA), as compared to the large current (for example, 200 mA) necessitated for programming, must be supplied from a programming terminal as a sense current when the cell is checked. This sense current is supplied to a selected cell via the PNPN element of the programming circuit. The sense current flows into the selected cell after the PNPN element has been activated. However, during the checking operation, before the PNPN element has been activated, electric charge would be stored in the P-ROM internal capacitances formed between the programming terminal and ground and in the capacitance formed in the sense current supply. Especially, since the triggering circuit is connected to the PNPN element of the programming circuit, the capacitance formed between the programming terminal connected to the PNPN element and ground is charged up to the potential equal to the clamp voltage (about 26 V) of the triggering circuit. These capacitances can be charged up by the sense current flowing through the first stage PN-junction (emitter-base junction) of the PNPN element into the triggering circuit. The electric charge stored in these capacitances would flow directly towards the cell when the PNPN element has been activated. In the followings, this current is called "spike current". Accordingly, in addition to the inherent sense current, the spike current which is a large current, would flow into the cell, and sometimes the spike current would destroy the base-emitter junction of the cell. As a result, there often occurred the accident that erroneous information was programmed in the cell by checking. This P-ROM was forced to be thrown away. Furthermore, where a large number of memory cells are integrated in one chip by way of the large scale integration (LSI) technique, it is important to minimize the unit area of one memory cell. Accordingly, the value of the programming current may be reduced to about ½ (for instance, 100 mA) of the heretofore used value, and thus erroneous programming of the cell caused by a spike current as well as damage of the cell occur more frequently. These shortcomings inevitably hinder mass-production of the LSI memory devices.

SUMMARY OF THE INVENTION

It is a principal object of the present invention to provide a monolithic integrated circuit having means for preventing internal circuits from being destroyed by checking.

Another object of the present invention is to provide a programmable monolithic integrated circuit having spike current prohibiting means which eliminates or minimizes generation of a spike current.

Still another object of the present invention is to provide a programmable monolithic memory circuit in which memory cells can be easily checked.

According to the present invention, there is provided a monolithic integrated circuit comprising at least one memory cell connected to row line and column line, a programming circuit having a PNPN element coupled to the column line, means for supplying a predetermined current to the PNPN element, a triggering circuit connected to the PNPN element for clamping it with a first voltage, means for selecting the memory cell, means for reading out the information prepared in the selected memory cell, and means for supplying a second voltage lower than the first voltage to the PNPN element for a predetermined period. The programmable monolithic integrated circuit of the present invention comprises means for supplying the second voltage lower than the first voltage (clamp voltage) supplied from the triggering circuit for a predetermined period to the PNPN element of the programming circuit. As a result, during the period before the PNPN-circuit has been activated, the amount of electric charge stored between the write terminal (which may be used also as an output terminal) and ground can be reduced as compared to the first voltage, by setting the PNPN element at the second voltage. Accordingly, the spike current is reduced, and hence the cell would not be erroneously destroyed or damaged. Especially, when a sense current is passed through a cell for its checking, the simultaneously occurring spike current can be sufficiently reduced. This is extremely effective for protecting the cells upon checking and for improving the yield.

BRIEF DESCRIPTION OF THE DRAWINGS

The above-mentioned and other objects, features and advantages of the present invention will become more apparent by reference to the following description of its preferred embodiments taken in conjunction with the accompanying drawings, wherein.

DESCRIPTION OF THE PRIOR ART

Figure 1:
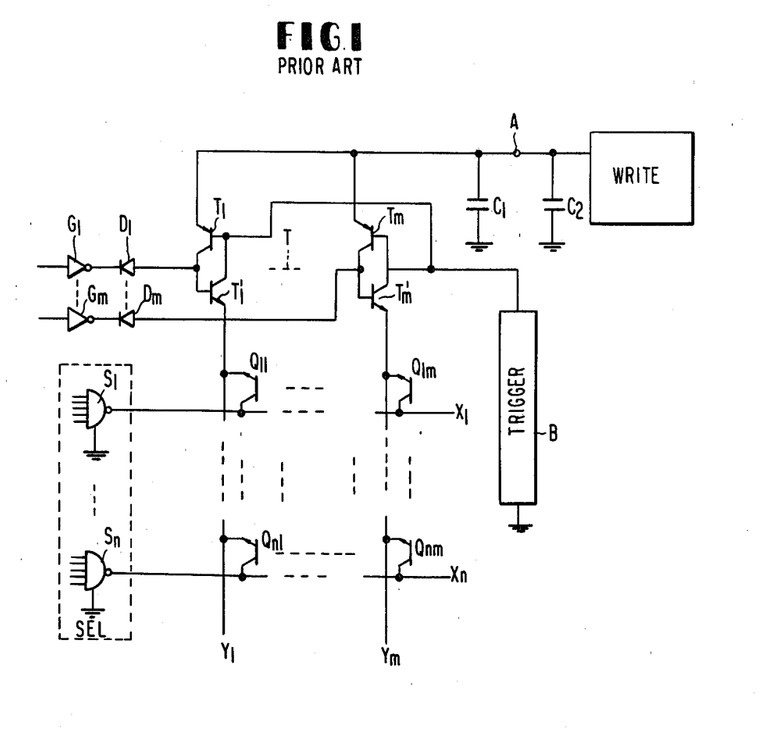
FIG. 1 is a schematic circuit diagram of an essential part of a programmable memory circuit and a programming checking circuit in the prior art.

Referring now to FIG. 1, an essential part of a programmable read-only memory (P-ROM) including a junction destruction type cell array $Q_1$-$Q_{nm}$, is illustrated. Programming circuits T having a PNPN element in which first PNP transistors $T_1$-$T_m$ and second NPN transistors $T_1'$-$T_m'$ are connected in series, are provided for the respective column lines $Y_1$-$Y_m$ of the cell array $Q_{11}$-$Q_{nm}$. To the P-type regions (emitter) in the first stages of these PNPN circuits are commonly supplied a large current upon programming and a sense current upon checking from a P-ROM programming device (WRITE) which is connected to a programming terminal A. This terminal A may be used also as an output terminal of the memory. Furthermore, to the collectors of the transistors $T_1$-$T_m$ and the bases of the transistors $T_1'$-$T_m'$ of the respective PNPN elements are applied selection signals from a programming checking column selection decoder consisting of gates $G_1$-$G_m$ and directional diodes $D_1$-$D_m$. On the other hand, to the row lines $X_1$-$X_n$ of the cell array is connected a row selection decoder (SEL). In addition, to the bases of the transistors $T_1$-$T_m$ and the collectors of the transistors $T_1'$-$T_m'$ of the respective PNPN elements are connected a triggering circuit B which assists charge-up for facilitating the conduction of the PN-junctions in the first stages of the PNPN elements as described previously. A voltage (for example, 26 V) that is a little lower than the clamp voltage (for example, 28 V) of the P-ROM programming device WRITE (this can also supply a sense current upon checking), is supplied from the triggering circuit B to the PNPN-circuit.

As will be apparent from FIG. 1, the respective emitters of the transistors $Q_{11}$-$Q_{nm}$ are connected to the corresponding column lines $Y_1$-$Y_m$, and the respective collectors are connected to the corresponding row lines $X_1$-$X_n$. In the illustrated circuit construction, an output circuit for providing the programmed information in the cells is omitted. In the case of programming in the cells of the prior art P-ROM, a row line and a column line connected to a cells to be programmed are designated. This designation is effected externally by making use of an address data input terminal of the P-ROM. Programming is made in such manner that a part of the address data consisting of a plurality of bits may be transferred to the column selection decoder and the other part may be transferred to the row selection decoder. For instance, in the case where the section $G_1$ and $D_1$ in the column selection decoder and the section $S_1$ in the row selection decoder generate selection signals, a high level signal (hereinafter called "H-level") is output from the inverter gate $G_1$ and a low level (hereinafter called "L-level") is output from the NAND gate $S_1$. As a result, the column line $Y_1$ and the row line $X_1$ are selected and thereby preparation is made for programming data in the cell $Q_{11}$. It is to be noted that at this moment an L-level is output from the column selection decoder sections $G_2$-$G_m$ and an H-level is output from the row selection decoder sections $S_2$-$S_n$. Accordingly, even if a programming current (200 mA) is supplied in common to the m programming circuits, the programming current supplied to the PNPN-elements consisting of the transistors $T_2$, $T_2'$-$T_m$, $T_m'$ would flow through the gates $G_2$-$G_m$ to the ground, and thus no current is supplied to the cells connected to the column lines $Y_2$-$Y_m$. On the other hand, since the gate $G_1$ connected the PNPN element consisting of the transistors $T_1$ and $T_1'$ is at an H-level, the programming current flows to the column line $Y_1$ when this programming circuit has been activated. Then, among the cells $Q_{11}$-$Q_{n1}$ connected to the column line $Y_1$, with regad to the cells $Q_{21}$-$Q_{n1}$, since the row selection decoder $S_2$-$S_n$ make an H-level, the row lines $X_2$-$X_n$ take the same potential, respectively, and thus the programming current cannot flow through these cells $Q_{21}$-$Q_{n1}$. That is, the programming current flows only through the cell $Q_{11}$ to the row line $X_1$ connected to the row selection decoder $S_1$ which then makes an L-level. This programming current flows to the ground in the decoder $S_1$. Accordingly, if the programming current is a sufficiently large current for destroying the emitter-base junction of the cell $Q_{11}$, the cell $Q_{11}$ is short-circuited and thus information "1" is programmed therein. As described above, all the cells can be designated to program information in the cells by successively changing the address.

A problem may arise when the cells are checked as described previously. More particularly, in order to check whether the base-emitter junctions in the respective cells have been already destroyed or not, it is necessary to designate the address of each cell and to supply a small current (about 20 mA) that is not liable to destroy the junction in the cell as a sense current from the programming terminal A. This sense current flows through the selected cell into the row selection decoder SEL after the selected PNPN element has been activated. At this moment, if the selected cell is normal, the primary breakdown would occur at the base-emitter junction of the cell in response to the sense current. Consequently, the programming terminal takes a predetermined voltage (for example, 10 V). However, if the cell has been already destroyed (secondary breakdown), the voltage at the programming terminal would become lower than the predetermined voltage. Accordingly, whether a selected cell is good or bad can be identified by passing a sense current therethrough and measuring the voltage at the programming terminal at that moment. In this case, it is to be noted that the sense current flows through the emitter-base path of the transistor $T_1$ to the triggering circuit B before the PNPN element has been activated. Accordingly, during that period the voltage at the programming terminal A would temporarily rise up to the clamp voltage (26 V) of the triggering circuit B.

Figure 2:
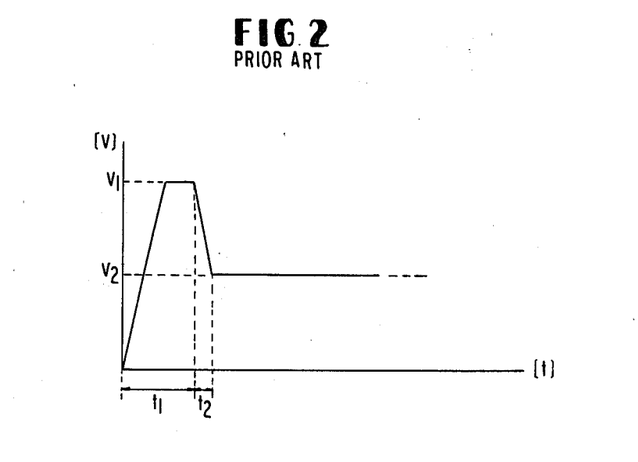
FIG. 2 is a diagram showing a potential change at a programming terminal in FIG. 1.

Now this process will be explained in more detail with reference to a voltage change diagram in FIG. 2. In this figure, the ordinate indicates the voltage at the programming terminal A and the abscissa indicates time. In FIG. 2, reference symbol $t_1$ represents the period until the PNPN element has been activated, after a sense current begins to flow into the triggering circuit B. The programming terminal A reaches the triggering clamp voltage during the period. Reference symbol $t_2$ represents the period after the PNPN element has been activated until the programming terminal A takes the predetermined potential. Reference symbol $V_1$ represents the triggering clamp voltage, and reference symbol $V_2$ represents the predetermined voltage at the programming terminal A when primary breakdown has occurred in the memory cell. Assuming that the sense current is 20 mA, when the cell is normal, $V_1 = 26$ V and $V_2 = 10$ V will be observed.

However, since capacitances $C_1$ and $C_2$ are present between the programming terminal A and the ground and across the output terminals (one being grounded) of the P-ROM programming device (WRITE) as shown in FIG. 1, these capacitances are charged up to the clamp voltage $V_1$ of the P-ROM programming device (WRITE) during the period. The stored electric charge is discharged during the period $t_2$ until the voltage is lowered from $V_1$ to $V_2$. The current caused by this discharge, that is, the spike current has a magnitude of:

$$\frac{(V_1 - V_2) \cdot (C_1 + C_2)}{t_2}$$

as approximated by a rectangular waveform, and it flows through the memory cell $Q_{11}$ in which primary breakdown has occurred.

Accordingly, due to generation of this spike current, an excessive current flows through into the selected cell, resulting in secondary breakdown (junction destruction) or damage of the cell. Therefore, it often occurred that a P-ROM which had been acceptable at the time point of manufacture became defective after the checking operation.

DETAILED DESCRIPTION OF THE PREFERRED EMBODIMENTS

Figure 3:
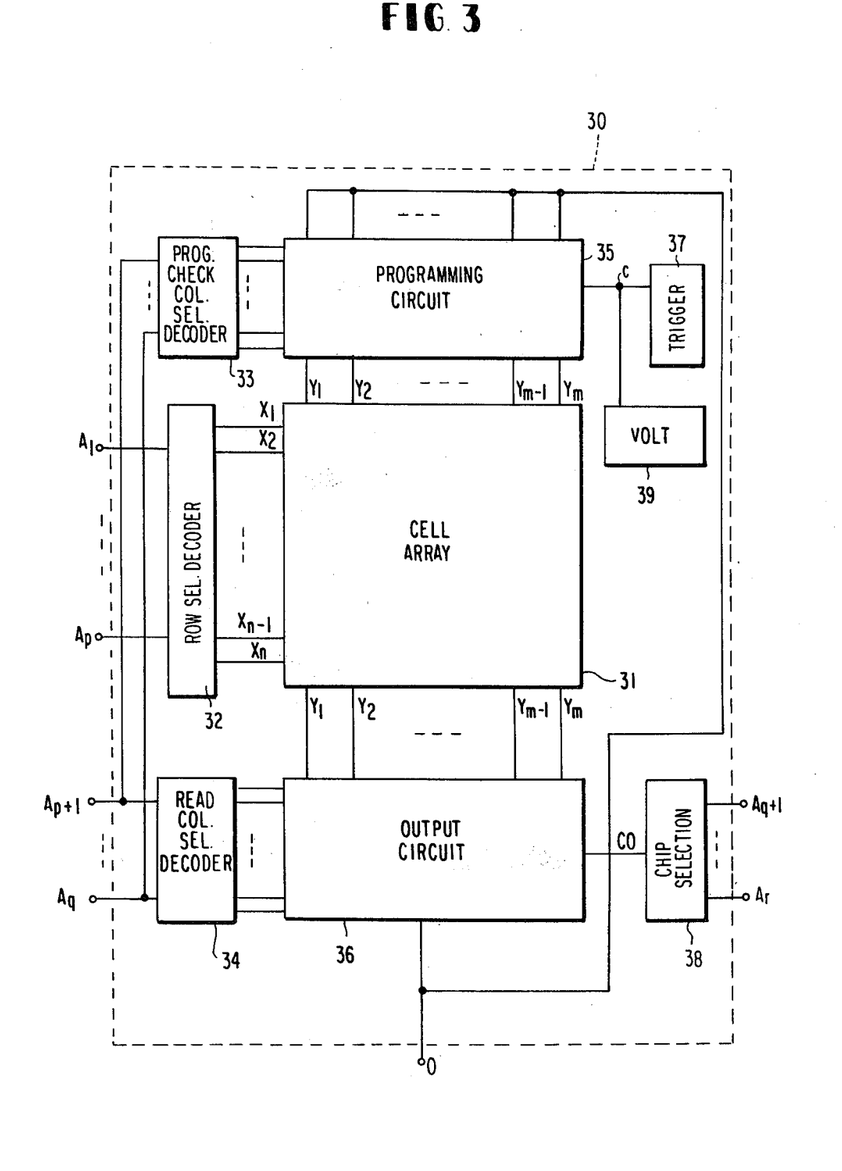
FIG. 3 is a block diagram within a programmable memory chip showing one preferred embodiment of the present invention.

FIG. 3 is a function block diagram within a P-ROM chip which shows one preferred embodiment of the present invention which has been designed to overcome the above-mentioned shortcoming. In FIG. 3, a broken line frame 30 represents a contour of a substrate of the chip. Within the chip are formed a cell array 31, a row selection decoder 32, a programming/checking column selection decoder 33, a read column selection decoder 34, a programming circuit 35, an output circuit 36, a triggering circuit 37, a chip selection circuit 38 and a voltage limiter circuit 39. An address data (q bits) is supplied to the decoders 32-34 via address input terminals ($A_1$ to $A_q$). The 1st to p-th bits are supplied from address input terminals $A_1$-$A_p$ to the row selection decoder 32. The (p+1)-th to q-th bits of the address data are supplied from address input terminals $A_{p+1}$-$A_q$ to the column selection decoders 33 and 34. Furthermore, the (q+1)-th to r-th bits of the control data are supplied from terminals $A_{q+1}$-$A_r$ to the chip selection circuit 38. Here it is assumed that the relation of $1 < p < q < r$ is kept. Of course, it will be obvious that the terminals $A_1$-$A_r$ for the r bits could be made to otherwise correspond to any bits in the address and control data. The chip selection circuit 38 is provided for the purpose of selecting a predetermined chip from a plurality of chips upon memory operation. Accordingly, it has the function of generating a control signal for activating the output circuit 36 of the illustrated chip only when the address data is supplied so as to direct one chip through the terminals. However, when information is programmed in the memory cell, the output circuit 36 must be inactivated and, therefore-and, the control data inactivates the output circuit 36 during programming. The row selection decoder 32 has the function of selecting a row line of the cell array in a similar manner to the row selection decoder in the prior art, and it operates in response to the address data through the address input terminals $A_1$-$A_p$ for setting one of the row lines at an L-level and the remaining row lines at an H-level. The column selection decoder 34 operates in response to the address data through the address input terminals $A_{p+1}$-$A_q$ for setting one of the column lines at an H-level and the remaining column lines at an L-level. This decoder is used when the information programmed in the cells are read out. The other column selection decoder 33 is a PNPN element selection decoder to be used for programming and checking, and it operates in a manner similar to the column selection decoder 34. It is to be noted that the address data to these two column selection decoders 33 and 34 could be the same. A detailed circuit diagram of these two column selection decoders 33 and 34 is shown in FIG. 6.

Figure 6:
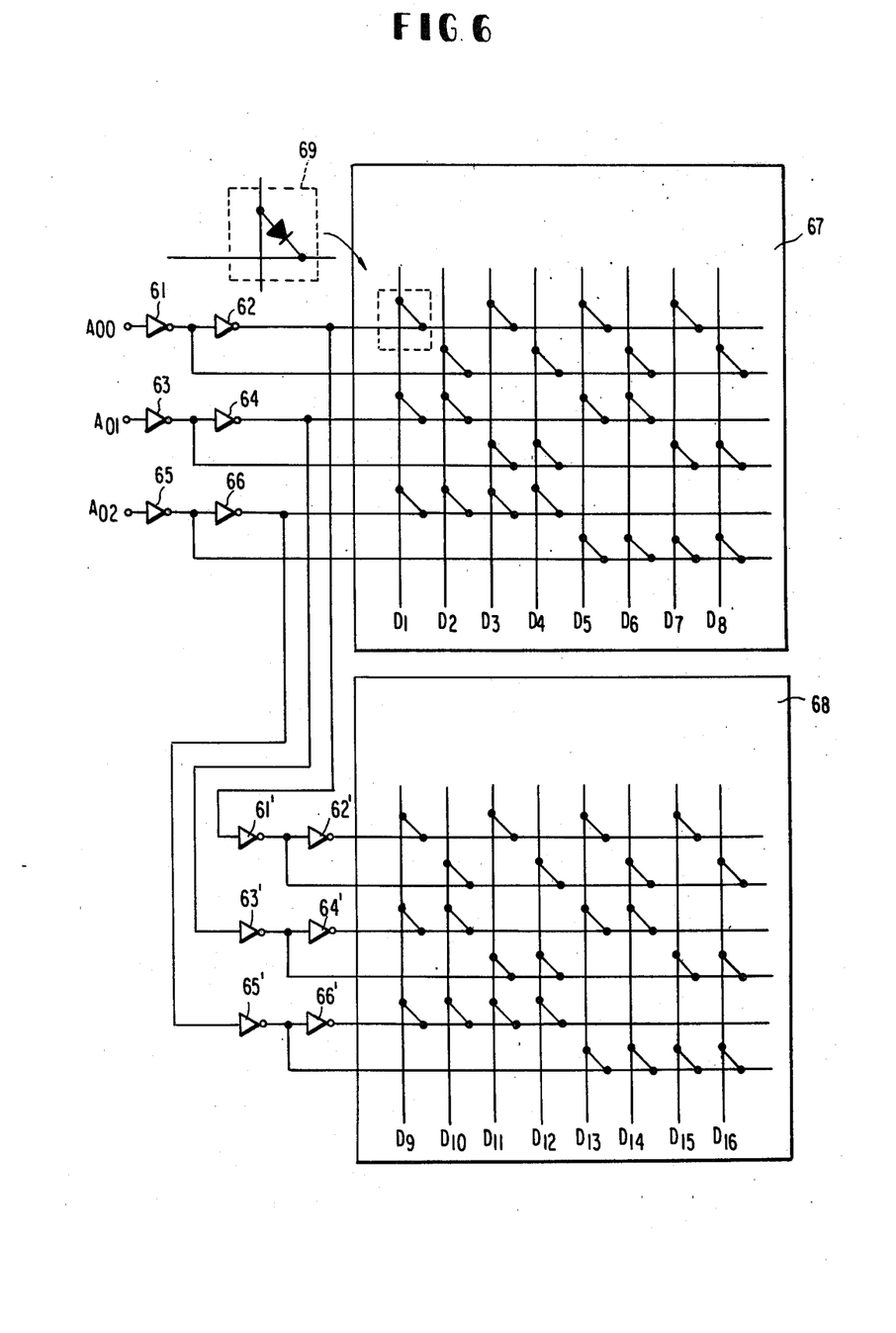
FIG. 6 is a schematic circuit diagram of a programming checking column selection decoder shown in FIGS. 3 and 4 and a read column selection decoder shown in FIG. 3.

In the column selection decoder illustrated in FIG. 6, 3 bits ($A_{00}$-$A_{02}$) are used as a column selection address to select a desired one column line from 8 column lines. The read column selection decoder 34 comprises gates 61-66 and a diode matrix circuit (block 67). The PNPN element selection decoder 33 comprises gates 61'-66' and another diode matrix circuit (block 68). The diode matrix circuits 67 and 68, respectively, have the same circuit construction in which column lines and row lines are interconnected via directional diodes (block 69) or the like at predetermined locations. It is to be noted that the diodes could be replaced simply by wirings to short-circuit the column lines to the row lines. In the illustrated diode matrix structure, the relation between the address data through the address input terminals $A_{00}$-$A_{02}$ and the corresponding output levels on the output lines $D_1$-$D_8$ or $D_9$-$D_{16}$ is as shown in Table 1 below.

could be the same as the heretofore known ones, more detailed description thereof will be omitted here.

Figure 7:
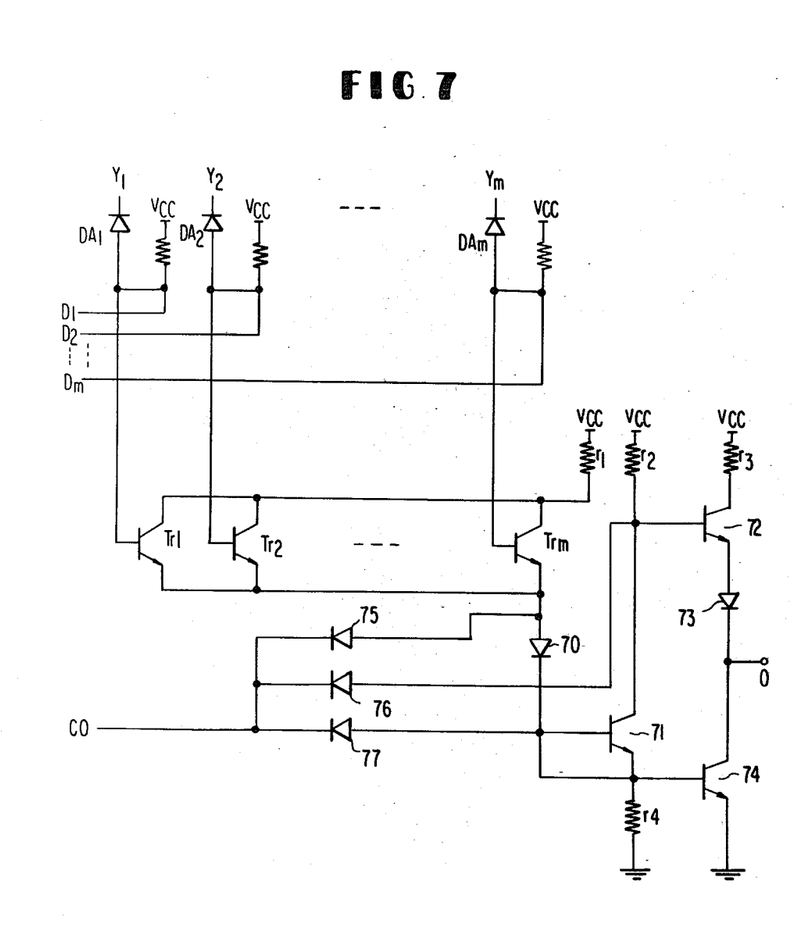
FIG. 7 is a schematic circuit diagram of an output section shown in FIG. 3.

As shown in the more detailed circuit diagram in FIG. 7, the output circuit 36 in FIG. 3 comprises transistors $T_{r1}$-$T_{rm}$ whose bases are connected to the respective column lines $Y_1$-$Y_m$ through diodes $DA_1$-$DA_m$, respectively, a transistor 71 whose base is connected via a diode 70 to the respective emitters of these transistors $T_{r1}$-$T_{rm}$, an output stage buffer circuit consisting of transistors 72 and 74 and a diode 73, and diodes 75-77 connected to the emitters of the transistors $T_{r1}$-$T_{rm}$, to the collector of the transistor 71 and the base of the transistor 72, and to the bases of the transistors 70 and 71, respectively. The diodes 75-77 are connected to one control line CO leading from the chip selection circuit 38. In addition, the respective collectors of the transistors $T_{r1}$-$T_{rm}$ and the collectors of the transistors 71 and 72 are connected to a power supply $V_{cc}$ via pull-up resistors $r_1$-$r_3$. On the other hand, the emitter of the transistor 71 is grounded via a resistor $r_4$. An output is derived from a junction between the diode 73 and the transistor 74 through an output terminal O. This output circuit 36 has a tri-state function (H-level, L-level and high-impedance states). If the output circuit 36 is an open collector type, the transistor 72, diode 73, resistor $r_3$ and power supply $V_{cc}$ for these elements would be unnecessary.

In addition, the triggering circuit 37 in the P-ROM shown in FIG. 3 has the function of assisting charge-up by supplying a voltage (26 V) that is a little lower than the clamp voltage (28 V) to the bases in the first stage of the PNPN elements in the programming circuit 35 similarly to the triggering circuit in the prior art.

Figure 4:
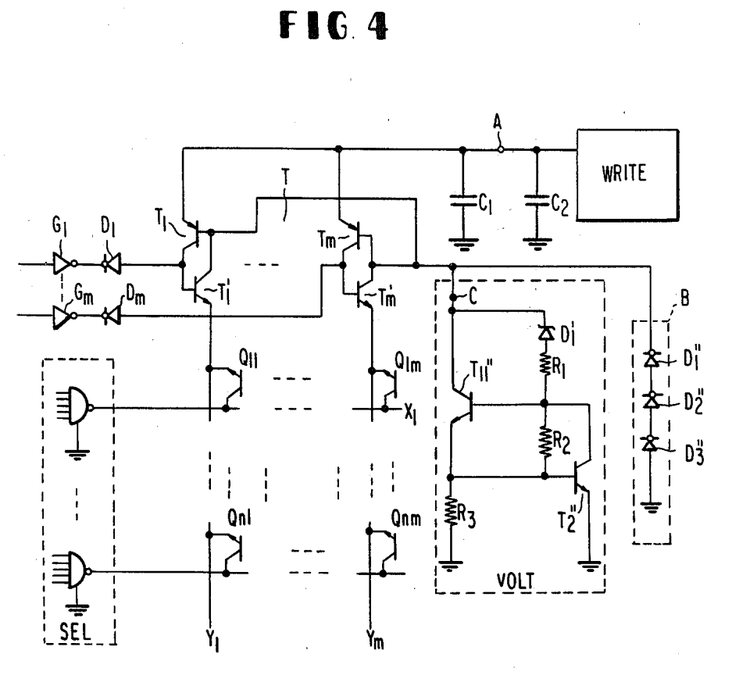
FIG. 4 is a schematic circuit diagram of an essential part of the blocks and programming checking means in FIG. 3.

Here it is to be noted that according to the present invention, a voltage limiter circuit represented by the block 39 in FIG. 3 is connected to the bases in the first stage of the PNPN elements. For explaining the circuit construction and operation of this voltage limiter circuit 39, reference should be made to FIG. 4. FIG. 4 is a schematic circuit diagram of the essential part of the P-ROM according to the present invention, which can achieve remarkable effects upon checking. As will be apparent from FIG. 4, the construction of the voltage limiter circuit (VOLT) 39 is such that a collector of a transistor $T_1''$ is connected to bases of transistors $T_1$-$T_m$, and to the base of this transistor $T_1''$ are connected a series connection of a Zener diode $D_1'$ and a resistor $R_1$ and a collector of a transistor $T_2''$. To the

TABLE 1

| $A_{00}$ | $A_{01}$ | $A_{02}$ | $D_1$, $D_9$ | $D_2$, $D_{10}$ | $D_3$, $D_{11}$ | $D_4$, $D_{12}$ | $D_5$, $D_{15}$ | $D_6$, $D_{14}$ | $D_7$, $D_{15}$ | $D_8$, $D_{16}$ |
|---|---|---|---|---|---|---|---|---|---|---|
| H | H | H | H | L | L | L | L | L | L | L |
| L | H | H | L | H | L | L | L | L | L | L |
| H | L | H | L | L | H | L | L | L | L | L |
| L | L | H | L | L | L | H | L | L | L | L |
| H | H | L | L | L | L | L | H | L | L | L |
| L | H | L | L | L | L | L | L | H | L | L |
| H | L | L | L | L | L | L | L | L | H | L |
| L | L | L | L | L | L | L | L | L | L | H |

In Table 1 above, H represents the $V_{cc}$ level and L represents a substantially fixed potential level (for example, ground level). From Table 1 it can be seen that only one column line is selected in response to the address data.

The programming circuit 35 shown in FIG. 3 includes PNPN-elements which are equal in number to the number of the column lines, and a desired one of which can be selected by the PNPN element selection decoder 33. Since the structure of the PNPN-element base of the transistor $T_2'$ are connected a resistor $R_2$ and the emitter of the transistor $T_1''$. In addition, a resistor $R_3$ is connected to the emitter of the transistor $T_1''$. Reference character C designates an ungrounded node of the voltage limiter circuit VOLT. Reference characters $D_1''$-$D_3''$ designate diodes. With regard to the remaining portion, the construction is similar to that described with reference to FIG. 1, and hence further description thereof will be omitted here.

Now description will be made on the state checking operation for a memory cell $Q_{11}$ in the above-described P-ROM in which a voltage limiter circuit characteristic of the present invention is provided. At first, address data are supplied to bring the memory cell $Q_{11}$ into a selected condition. Under such a condition, if a small current (about 20 mA) that is not liable to program in the memory cell $Q_{11}$ is made to flow as a sense current from the P-ROM programming device (WRITE) through the memory cell $Q_{11}$, then a voltage $V_1'$ at a programming terminal A would rise until sufficient charge-up for activating the PNPN element has been achieved. However, in the illustrated embodiment the voltage at the programming terminal A is clamped at a voltage which is approximately equal to a predetermined voltage $V_2'$ (about 10 V) when a memory cell achieves primary breakdown, owing to the existence of the voltage limiter circuit VOLT. When the PNPN element has been sufficiently charged up, the PNPN element is activated. Then, the memory cell $Q_{11}$ is subjected to primary breakdown due to the sense current flowing therethrough, and so, the programming terminal A takes the predetermined voltage $V_2'$. At this moment, similarly to the heretofore known P-ROM, capacitances $C_1$ and $C_2$ are discharged, and hence a spike current having the following magnitude flows through the memory cell $Q_{11}$:

$$\frac{(V'_1 - V'_2) \cdot (C_1 + C_2)}{t2}$$

However, in the illustrated embodiment, the relation of:

$$V_1' \approx V_2'$$

is fulfilled, so that the spike current is extremely reduced as compared to the prior art P-ROM, and thereby destruction or damage of the memory cell upon checking its state can be prevented.

Figure 5:
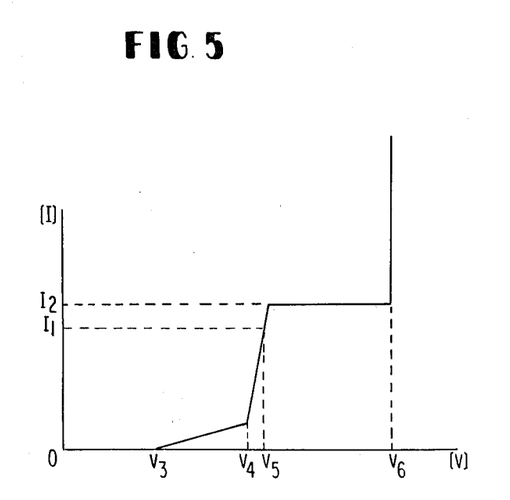
FIG. 5 is a voltage-current characteristic diagram upon operation of a voltage limiter circuit in FIG. 4.

The operation of the voltage limiter circuit VOLT at this time will be described in greater detail with reference to the current-voltage characteristic diagram shown in FIG. 5. In FIG. 5, reference character $I_1$ represents a sense current (20 mA), and reference character $I_2$ represents a constant current (40 mA) of the voltage limiter circuit VOLT. Assuming now that a current flows into the voltage limiter circuit VOLT via the emitter-base path of the transistor $T_1$ and through the node C, when the voltage at the node C has reached a voltage $V_3$ (8 V), Zener breakdown would occur in the Zener diode $D_1'$. Hence a current flows through the resistors $R_1$, $R_2$ and $R_3$ in series via the Zener diode $D_1'$, and due to the impedance of the series circuit of the resistors $R_1$, $R_2$ and $R_3$ the voltage at the node C would rise. Furthermore, as the current is increased, the voltage across the resistor $R_2$ reaches a threshold voltage $V_4$ of the transistor $T_1''$, and then the transistor $T_1''$ is turned on. As the current increases further, when the voltage across the resistor $R_3$ has risen up to the threshold voltage of the transistor $T_2''$, the transistor $T_2''$ is turned on, and thereby the circuit operates so as to present the constant current characteristics $I_2$ (40 mA) as shown in FIG. 5. The appearance of the constant current $I_2$ is due to the fact that most of the programming current ($>I_2$) flows into the memory cell $Q_{11}$ via the PNPN element.

As the current is further increased, when the diodes $D_1''-D_3''$ in the triggering circuit B undergo primary breakdown, again a low impedance condition appears. This is a clamp voltage $V_6$ (26 V) of the triggering circuit B. A voltage $V_5$ (10 V) represents the voltage at the programming terminal A when the sense current $I_1$ flows, and this voltage $V_5$ is preset by the resistors $R_1$, $R_2$ and $R_3$ so as to be approximately equal to the predetermined voltage $V_2'$ (10 V) at the programming terminal when the memory cell $Q_{11}$ undergoes primary breakdown.

Thus, the spike current can be reduced by suppressing the amount of electric charge stored at the terminal A by providing the voltage limiter circuit. Accordingly, an excessive current would never flow into the cell upon checking it, and therefore, it would never occur that a cell is destroyed or damaged during the checking process.

Consequently, if the voltage at the node C of the voltage limiter circuit is preset to be lower than the clamp voltage of the triggering circuit B, then the object of the present invention of reducing a spike current can be well achieved.

Figure 8:
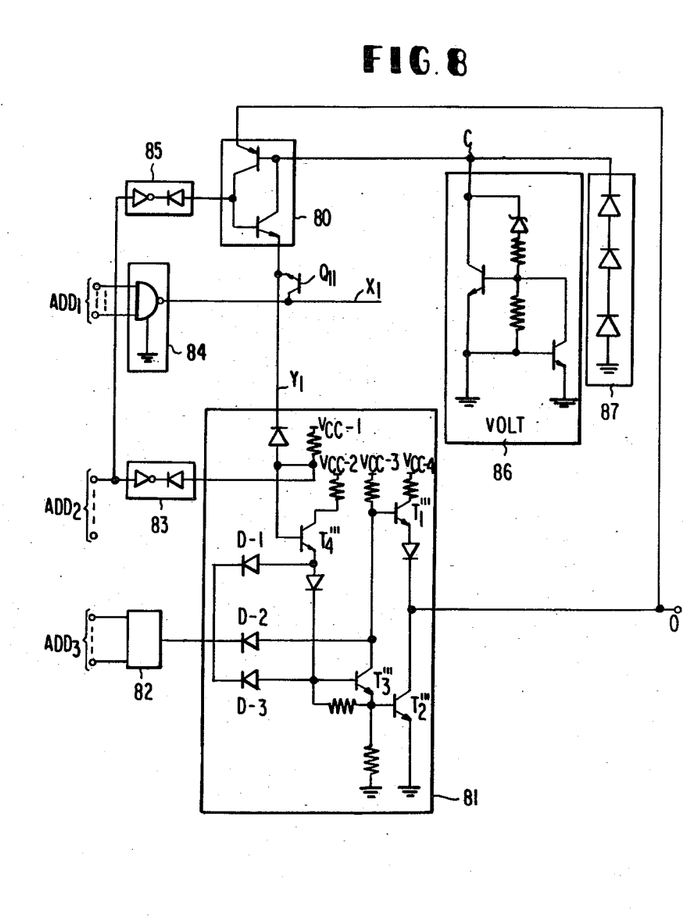
FIG. 8 is a connection diagram for a 1-bit cell and to associated peripheral circuits in the preferred embodiment shown in FIG. 3.

A check operation, a programming operation and a reading-out operation for a one-bit cell $Q_{11}$ will now be explained with reference to FIG. 8. In FIG. 8, to the emitter of the cell $Q_{11}$ is connected a column line $Y_1$, and to the collector is connected a row line $X_1$. Moreover, to the column line $Y_1$ are connected a programming circuit 80 having a PNPN element and an output circuit 81. In addition, a column selection decoder 83 for activating the output circuit 81 is also connected to the column line $Y_1$. A PNPN element column selection decoder 85 is connected to the programming circuit 80. Further, a row selection decoder 84 is connected to the row line $X_1$. Furthermore, to the programming circuit 80 are connected a triggering circuit 87 and a voltage limiter circuit 86. To the row selection decoder 84, the column selection decoder 83 and the PNPN element selection decoder 85 are externally supplied address data via address terminal groups $ADD_1$ and $ADD_2$. Further, address data for chip selection are supplied from another address terminal group $ADD_3$ to a chip selection circuit 82, and the output of the chip selection circuit 82 is applied to the output circuit 81. Control data for inactivating the output circuit 81 are also supplied from address terminal group $ADD_3$ when a programmed information is programmed in the cell $Q_{11}$ and the cell $Q_{11}$ is checked. The data read out of the cell are derived from an output terminal O via the output circuit 81. On the other hand, this output terminal O can be used also as a programming terminal or a checking terminal. Accordingly, the output terminal O is also connected to a P-type region in the first stage of the PNPN element.

Upon effecting a checking of whether the cell $Q_{11}$ has its PN junction (a base-emitter junction) destroyed or not, address data for selecting the cell $Q_{11}$ are input via the address terminals, and a sense current (20 mA) is passed through the cell $Q_{11}$ from the terminal O. At this instance, the internal impedances of the voltage limiter circuit 86 are preset so that the node C of the voltage limiter circuit 86 may be clamped at about 10 V. The output circuit 81 is inactivated. As a result, if the cell $Q_{11}$ is normal, then the sense current flows from the PNPN element through the cell $Q_{11}$ and the row selection decoder 84 to the ground. At this moment, primary breakdown would occur in the cell $Q_{11}$, and thus the voltage at the terminal O is lowered to about 10 V. On the other hand, if the cell $Q_{11}$ has already reached secondary breakdown (or has been short-circuited), then the voltage at the terminal O is lowered to as low as about 6 V. Accordingly, whether a cell is good or bad can be easily determined by measuring the voltage level at the terminal O. Moreover, in the illustrated embodiment of the present invention, the voltage at the terminal O can be held at 10 V during the period before the PNPN element has been activated. This voltage is equal to the voltage at the terminal O when the cell is normal. Accordingly, generation of the spike current caused by the capacitance at the terminal O can be almost eliminated, and hence it would never occur that upon checking a cell is erroneously destroyed or damaged.

Further, when it has been confirmed that all the cells are normal, the subsequent programming operation is commenced. The programming operation is such that a large current (200 mA) is repeatedly passed from the terminal O through a cell several times when logic "1" is to be programmed in the cell, whereas a current is inhibited from being passed through a cell when logic "0" is to be programmed in the cell.

Description will now be made of the operation of subsequently reading out information stored in a cell. At first, address data are input to the P-ROM through the address terminal groups $ADD_1$, $ADD_2$ and $ADD_3$ to select a desired cell such as, for example, the cell $Q_{11}$, and a control signal CO (at an H-level in the illustrated embodiment) for activating the output terminal 81 is generated by the chip selection circuit 82. It is to be noted that when the chip is not selected, an L-level signal is output from the circuit 82. Consequently, the respective base potentials of the transistors $T_1'''$ and $T_2'''$ in the output stage become an L-level, and hence both the transistors $T_1'''$ and $T_2'''$ are brought into a cutoff condition. On the other hand, if the chip in question is selected, the path of the current flowing into the chip selection circuit 82 via diodes D-1, D-2 and D-3 is eliminated due to the generation of an H-level signal at the output of the circuit 82. Accordingly, if "1" has been programmed in the cell $Q_{11}$, then a current flows from the voltage source $V_{cc}$-1 through the short-circuited cell $Q_{11}$ to the ground in the row selection decoder 84. As a result, transistors $T_4'''$ and $T_2'''$ are cut off, and hence an H-level is output at the terminal O via the transistor $T_1'''$. On the other hand, if "0" has been preset in the cell $Q_{11}$, then the path of the current flowing from the voltage source $V_{cc}$-1 through the cell $Q_{11}$ to the ground in the row selection decoder 84 is eliminated, and hence the transistors $T_4'''$, $T_3'''$ and $T_2'''$ are turned on and the transistor $T_1'''$ is cut off. Therefore, an L-level (about ground level equal to the fixed potential level) is output at the terminal O.

As described above, according to the illustrated embodiment of the present invention, an improved P-ROM can be obtained in which the cells would never be destroyed upon checking.

Here it is to be noted that among the checks which must be conducted for the above-described P-ROM's by the manufacturer, there exists the check for confirming whether or not the emitter and collector electrodes of the respective cells are correctly connected to the column lines and row lines provided by conductive layers formed on a semiconductor chip. This check is effected by passing a current substantially equal to the above-described sense current in the same manner as the check before programming. If the cells are correctly connected, then a predetermined voltage (about 10 V) will appear at the terminal O. However, in the event that there exists defective connections (for example open connections) to the cells, then all the current would flow into the voltage limiter circuit 86. Accordingly, the voltage at the terminal O would become the voltage preset by the voltage limiter circuit 86. Here it is to be noted that if the preset voltage of the voltage limiter circuit 86 is selected at about 10 V in order to eliminate the generation of the spike current, then the defective connections to the cells cannot be checked. Therefore, in this case the check for the defective connections is made possible by selecting the preset voltage of the voltage limiter circuit 86 higher than 10 V (for example, at about 16 V). However, for the purpose of reducing the spike current nearly to zero, and taking into consideration the fluctuations in the threshold values of the cells and their peripheral circuits due to the manufacturing conditions, it is preferable to select the difference between the preset voltage of the voltage limiter circuit and the above-described predetermined voltage, i.e. the voltage which will appear at terminal O if the cell is operating properly, as small as possible.

Now another preferred embodiment of the present invention in which the spike current can be fully suppressed and yet detection of defective connections is facilitated, will be described with reference to FIG. 9. In this preferred embodiment, the first embodiment shown in FIG. 4 has been further improved. In a memory chip having a voltage limiter circuit, the clamp voltage of the triggering circuit may appear at the programming terminal (output terminal) A as is the case with the conventional chip, if connections of memory cells are defective. Consequently, the proper P-ROM connections can be easily checked and the quality can be guaranteed.

Figure 9:
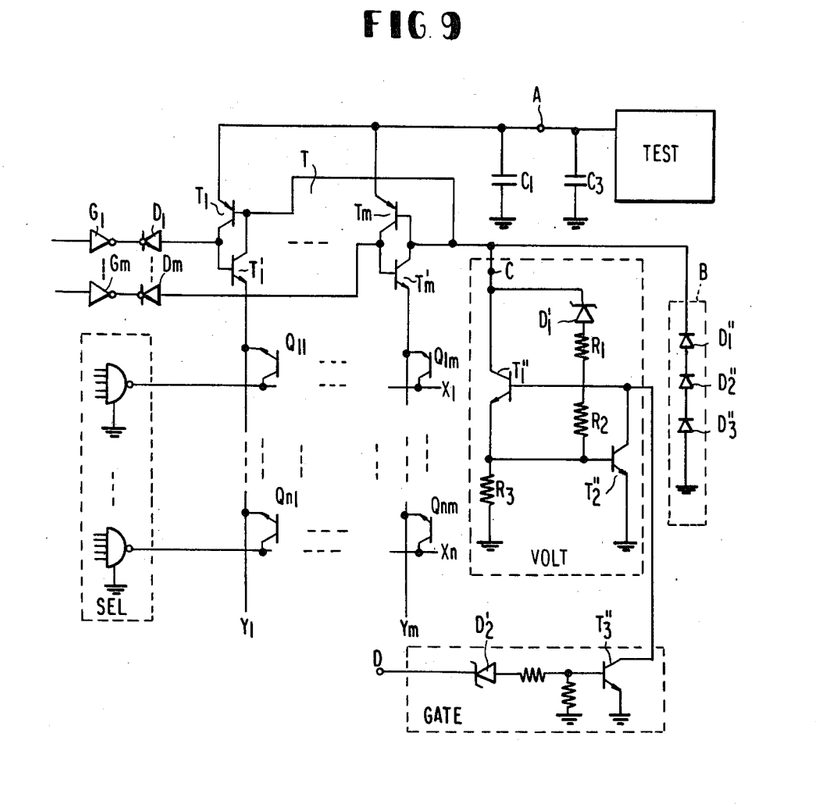
FIG. 9 is a schematic circuit diagram of an essential part of another preferred embodiment of the present invention.

The circuit construction shown in FIG. 9 is characterized by the provision of a gate circuit GATE adapted to inactivate forcedly the voltage limiter circuit VOLT when a predetermined control signal (for example H-level signal) is supplied thereto from a terminal D. In this embodiment, a constant test voltage source TEST for supplying such a small current for checking that is not liable to program in the memory cell is coupled to a programming terminal A. This TEST circuit has an internal capacitance $C_3$. The gate circuit GATE consists of a transistor $T_3''$ whose collector is connected to the collector of the transistor $T_2''$ in the voltage limiter circuit VOLT and whose base is connected to a Zener diode $D_2'$, and the terminal D is connected to the Zener diode $D_2'$. With regard to the remaining portion, the circuit construction is similar to that described previously with reference to FIG. 4, and therefore, further description thereof will be omitted here.

Figure 10:
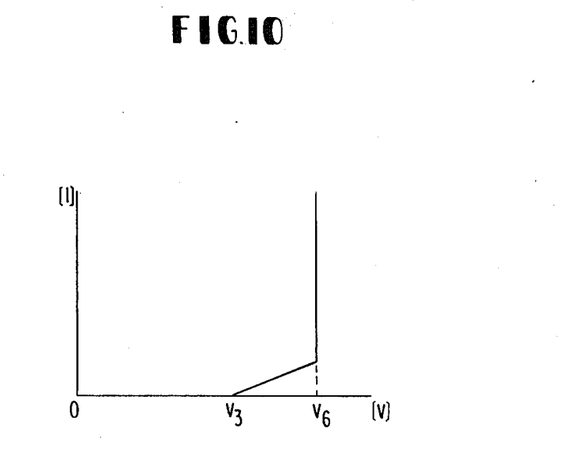
FIG. 10 is a voltage-current characteristic diagram upon operation of a voltage limiter circuit shown in FIG. 9.

Operation characteristics of the voltage limiter circuit VOLT when the H-level signal is applied to the terminal D, are shown in FIG. 10. In FIG. 10, a voltage $V_3$ indicates the voltage at which the Zener diode $D_2'$ occurs the Zenor breakdown. A voltage $V_6$ indicates a triggering clamp voltage.

At first, the terminal D is held at an L-level, and the small current for the memory cells $Q_{11}$–$Q_{nm}$ is supplied from the constant test voltage source TEST. After the PNPN element is activated by this small current and the selected one memory cell is broken down, the control signal (the H-level signal) is applied to the gate circuit GATE. Then the Zener diode $D_2'$ breaks down and the transistor $T_3''$ is activated. Consequently, the voltage limiter circuit VOLT presents operation characteristics (FIG. 10) determined principally by the impedance of the resistor $R_1$, and thus it becomes inactive.

Now, if the selected memory cell is normally connected to the row line and the column line, the programming terminal A takes the predetermined voltage immediately. This is because the current flows immediately to the selected memory cell, as the PNPN element has been already activated or at least the first stage PN-junction of the PNPN element has been activated.

On the other hand, if the selected memory cell is defectively connected to the row and column lines, the current cannot flow to the memory cell; therefore, the programming terminal A rises in potential up to the clamp voltage $V_6$ of the triggering circuit B. Accordingly, the check of whether the selected memory cell is normally connected or not can be achieved easily, and the quality of programming in P-ROM's similar to that in the conventional P-ROM's can be guaranteed.

As described above, according to the present invention a voltage limiter circuit for clamping the voltage at the programming terminal when a sense current is made to flow from the programming terminal to the selected memory cell via the PNPN element at substantially the same voltage as the predetermined voltage, is provided in a P-ROM. Accordingly, in the event that a sense current is made to flow to a memory cell prior to a programming operation for the purpose of checking whether the memory cell has been already short-circuited (destroyed) or not, the programming terminal would not rise up to the triggering clamp voltage, and the electric charge stored in the capacitance of the P-ROM and the programming or checking device (WRITE, TEST) is extremely reduced as compared to the prior art. Therefore, the spike current generated by the discharge of these capacitances can be minimized. Accordingly, erroneous programming caused by a spike current upon checking an open-circuit property of the memory cell can be prevented. Furthermore, if a gate circuit for inactivating the above-described voltage limiter circuit is additionally provided, the triggering clamp voltage appears at the programming terminal when the open-circuit property of the memory cell is defective, and therefore, there is an advantage that a quality of programming similar to that in prior art P-ROM's can be obtained.

Figure 11:
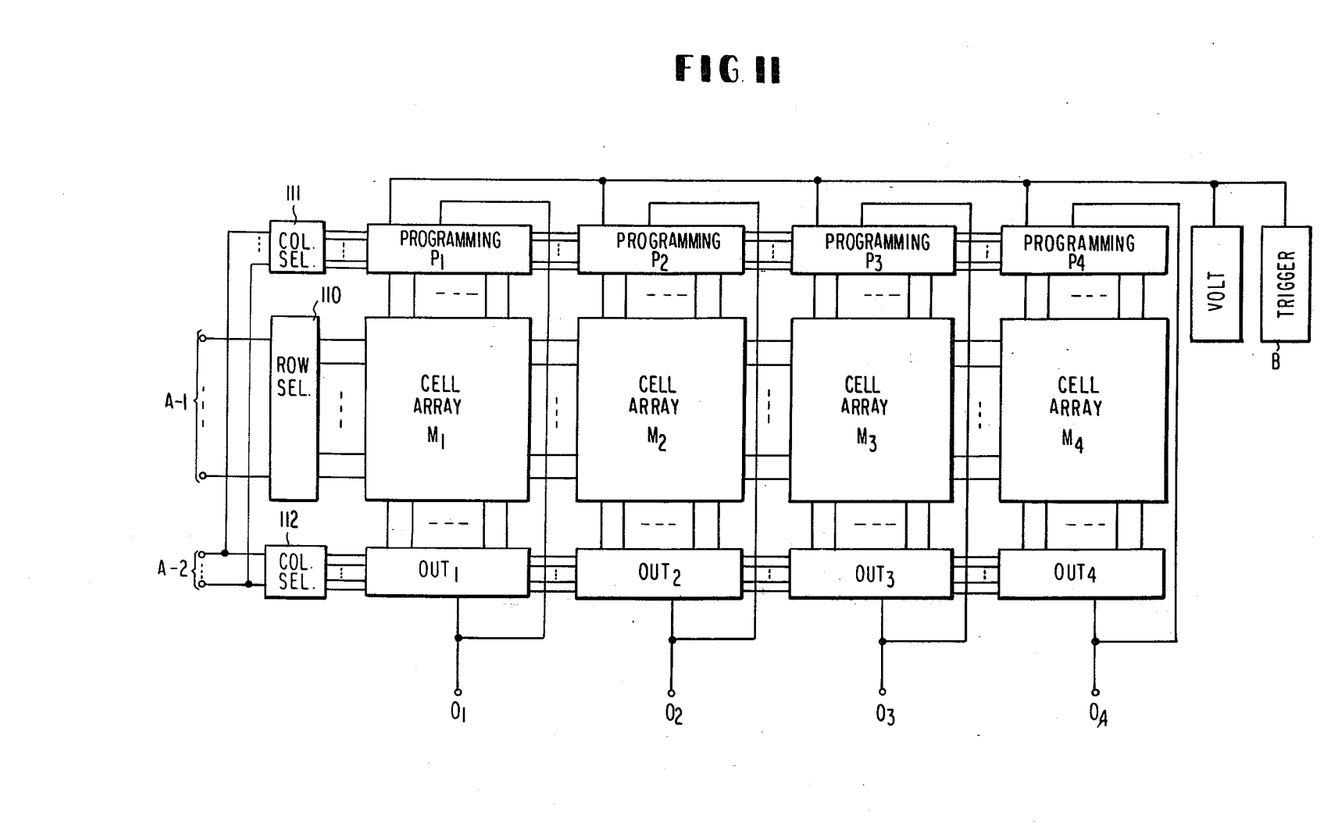
FIG. 11 is a block diagram of a programmable memory chip used as a parallel output type according to still another preferred embodiment of the present invention.

While the above preferred embodiments of the present invention have been described in connection with P-ROM's of serial data read out type which have only one output terminal equal to the programming terminal, the present invention is equally applicable to P-ROM's of parallel data read out type. This modification will be described with reference to FIG. 11. Since the circuit operation is the same as that described with reference to FIG. 3, its description will be omitted and description will be made only of the circuit connections. FIG. 11 is a block diagram of a P-ROM chip of 4-bit parallel data read out type. Accordingly, there are provided four output terminals $O_1$–$O_4$, and in association with the respective output terminals, there are provided cell arrays $M_1$–$M_4$ and programming circuits $P_1$ to $P_4$. On the other hand, column selection decoders 111 and 112, a row selection decoder 110, a triggering circuit B and a voltage limiter circuit VOLT are provided in common to all the memory cell arrays. However, provision must be made such that a programming current may be supplied independently from the respective output terminals $O_1$–$O_4$ to the corresponding programming circuits $P_1$–$P_4$ having PNPN elements.

Moreover, the P-ROM having a voltage limiter circuit according to the present invention need not be formed on an independent chip, but could be integrally formed on a chip having logic/calculation functions such as micro-processors or the like. In addition, the present invention is equally applicable to conventional memory devices (for example ROM's or RAM's) having memory cells or a programmable logic array (PLA) which has the same cell structure as the memory and in which a programming in the cells is effected on the basis of a program. Further, the terminals $A_1$ to $A_r$ (shown in FIG. 3) are used as address terminals in memory operation. For example, the terminals $A_1$ to $A_q$ are used as cell selection address terminals, and the terminals $A_{q+1}$–$A_r$ are used as chip selection address terminals. On the other hand, the the same terminals $A_1$ to $A_r$ are used also as checking and programming address terminals. In this way, the terminals $A_1$ to $A_p$ are used as address terminals for row line selection, and the terminals $A_{p+1}$ to $A_q$ are used as address terminals for PNPN element selection. Particularly, the terminals $A_{q+1}$ to $A_r$ are used as control signal input terminals for inactivating the output circuit 36. Furthermore, the voltage limiter circuit 39 and/or the triggering circuit 37 may be located outside the P-ROM chip 30 and coupled to the chip 30 by cables or the like.

What is claimed is:

1. An integrated circuit comprising a plurality of memory cells each having a PN junction for storing binary coded information in accordance with whether said PN junction is destroyed or not, supplying means for supplying a programming current for destroying said PN junctions, said supplying means having a parasitic capacitance, selecting means for selecting at least one memory cell, transferring means coupled to said supplying means and said memory cell selected by said selecting means for transferring said programming current to the selected memory cell, and control means coupled to said transferring means for suppressing an accumulation of an undesired charge in said parasitic capacitance, whereby a large current due to said undesired charge is prevented from flowing through said selected memory cell.

2. An integrated circuit as claimed in claim 1, in which said transferring means includes a PNPN element having a PNP transistor and an NPN transistor, a base region of said PNP transistor being connected to a collector region of said NPN transistor, and a collector region of said PNP transistor being connected to a base region of said NPN transistor.

3. An integrated circuit as claimed in claim 1, in which said control means includes a voltage clamp circuit and a voltage limiter circuit, said transferring means being triggered at a first potential by said voltage clamp circuit when said programming current is supplied to said selected memory cell, and said programming circuit being held at a second potential that is lower than said first potential by said voltage limiter circuit during a predetermined period.

4. A monolithic integrated circuit formed on a semiconductor chip comprising a memory cell having a PN-junction and coupled to a row line and a column line, means for selecting said row line and said column line in response to an address signal, an address terminal receiving said address signal, means for supplying a programming current to said PN-junction of said memory cell, a programming circuit having a PNPN element and transferring said programming current to said PN junction, said PN-junction being destroyed by said programming current, means for selecting said programming circuit in response to said address signal, an output circuit coupled to said column line and transferring said programmed information in said memory cell to an output terminal, a voltage clamp circuit coupled to an N-type region in the first stage of said PNPN element for activating quickly said PNPN element of said programming circuit by triggering at a first potential, and a voltage limiter circuit for holding said N-type region of said PNPN element at a second potential that is lower than said first potential during a predetermined period.

5. A circuit as claimed in claim 4, in which said programming current is supplied to said memory cell through said output terminal.

6. A circuit as claimed in claim 4, further comprising means for checking said memory cell by applying a checking current to said memory cell by using said programming-current supplying means.

7. A circuit as claimed in claim 4, in which said voltage limiter circuit is coupled to a control circuit, said control circuit switching said second potential to said first potential at said N-type region of said PNPN element by applying a control signal to said voltage limiter circuit after said predetermined period.

8. A combination comprising a plurality of memory cell blocks storing programmed data therein, each block including a plurality of memory cells, output circuits coupled to said memory cell blocks, respectively, for reading out said programmed data to a plurality of output terminals, means for selecting one memory cell in each block, a plurality of programming circuits for programming said data in selected memory cell by supplying a programming current, said programming circuits being coupled to said output terminals, respectively, a voltage clamp circuit for triggering said programming circuits with a first potential, and a voltage limiter circuit for holding said programming circuit at a second potential that is lower than said first potential during a predetermined period.

9. A monolithic integated circuit comprising a terminal through which a writing current and a checking current flow, a plurality of memory elements responsive to said writing current for storing information, transferring means coupled to said terminal and said memory elements for selectively transferring said writing current and said checking current from said terminal to said memory elements when activated, selectively activating means for selectively activating said transferring means, applying means provided separately from said selectively activating means and coupled to said transferring means for applying a predetermined voltage to said transferring means when activated, and limiting means coupled to said transferring means for limiting the voltage at said terminal to a value lower than said predetermined voltage.

10. A monolithic integrated circuit as claimed in claim 9, in which said applying means is activated and said limiting means is inactivated when said writing current flows through said transferring means from said terminal, and in which said applying means is inactivated and said limiting means is activated when said checking current flows through said transferring means from said terminal.

11. A monolithic integrated circuit as claimed in claim 10, in which said limiting means, when activated, holds the voltage at said terminal at a substantially constant voltage slightly higher than the voltage which would appear at said terminal when said checking current flows through said transferring means in the absence of said limiting means.

12. A monolithic integrated circuit as claimed in claim 9, in which said transferring means includes a PNPN element to which said limiting means is coupled, said limiting means holding said terminal at a substantially constant voltage until said PNPN element becomes active after a substantially constant current flows to said limiting means.

* * * * *